(12) United States Patent
Freitas

(10) Patent No.: US 7,844,843 B2
(45) Date of Patent: Nov. 30, 2010

(54) IMPLEMENTING POWER SAVINGS IN HSS CLOCK-GATING CIRCUIT

(75) Inventor: David A. Freitas, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 140 days.

(21) Appl. No.: 12/341,079

(22) Filed: Dec. 22, 2008

(65) Prior Publication Data

US 2010/0156466 A1  Jun. 24, 2010

(51) Int. Cl.
*G06F 1/26* (2006.01)
*H03K 19/00* (2006.01)

(52) U.S. Cl. ............... 713/320; 713/330; 713/340; 713/400; 326/93; 716/16

(58) Field of Classification Search ............. 326/93–98; 327/141, 144, 147, 156; 713/320, 322, 324, 713/330, 340, 500, 600; 716/16
See application file for complete search history.

(56) References Cited

U.S. PATENT DOCUMENTS 7,471,333 B2 * 12/2008 Steimle et al. ............. 348/372

| | | | | |
|---|---|---|---|---|
| 2009/0055668 A1 * | 2/2009 | Fernsler et al. | ............. | 713/322 |
| 2009/0193283 A1 * | 7/2009 | Blaner et al. | ............. | 713/600 |
| 2009/0217068 A1 * | 8/2009 | Fernsler et al. | ............. | 713/322 |
| 2009/0224812 A1 * | 9/2009 | Fujisawa | ............. | 327/276 |
| 2009/0267649 A1 * | 10/2009 | Saint-Laurent et al. | ........ | 326/95 |

* cited by examiner

*Primary Examiner*—Vibol Tan
(74) *Attorney, Agent, or Firm*—Joan Pennington

(57) ABSTRACT

A power saving clock-gating method and a power saving clock-gating circuit for implementing power savings in High Speed Serializer-deserializer (HSS) cores, and a design structure on which the subject circuit resides are provided. The power saving clock-gating circuit includes a clock gate signal used to initiate the starting and stopping of the C2 clocks. The clock gate signal is applied to a first latch of plurality of current-mode logic latches in a clock gate aligner block, which provides clock gate aligned signal to synchronously start a C2 clock generator. A power savings logic circuit generates a power down signal to turn off the plurality of current-mode latches and predefined clock buffers after the C2 clocks have been started, and then responsive to a changed state of the clock gate signal to turn on the predefined clock buffers and the plurality of current-mode logic latches to begin another synchronous start operation.

20 Claims, 7 Drawing Sheets

IMPLEMENTING POWER SAVINGS IN HSS CLOCK-GATING CIRCUIT

FIELD OF THE INVENTION

The present invention relates generally to the data processing field, and more particularly, relates to a power saving clock-gating method and a power saving clock-gating circuit for implementing power savings in High Speed Serializer-deserializer (HSS) cores, and a design structure on which the subject circuit resides.

DESCRIPTION OF THE RELATED ART

High Speed Serializer-deserializer (HSS) cores are used in application-specific integrated circuits (ASICs) and custom integrated circuits for communication from processor-to-processor and processor-to-input/output devices.

An existing HSS phase locked loop (PLL) clock design requires the capability of each of multiple PLLs to start a clock C2 output at a synchronize point in time. The clock output C2 is equal to ½ the bit rate of a high frequency clock output C1. To provide this function, a C2 output divider for each PLL is turned on synchronously. Because a single reference clock is used as the clock reference to all of the PLLs, whenever the PLLs are locked to the reference clock, the feedback clocks of each PLL are phase locked to the reference clock. Assuming minimal phase error between PLLs, all feedback clocks from each PLL also are phase locked to each other.

Synchronism across multiple High Speed HSS cores requires clock signal gating circuitry. A signal called Clock Gate (+CGATE) is provided to a clock-gating block from the control logic, which initiates the starting, and stopping of the output C2 clocks. The +CGATE signal must be timed to go low to start the C2 clocks prior to a rising edge of the Feedback clock, which is phase locked to the reference clock. A latch inside the clock-gating block aligns the +CGATE signal to the next rising edge of the Feedback clock. To accommodate various delays in a PLL divider, additional latches are needed in the clock-gating block to align the +CGATE clock down to an exact C1 clock cycle which allows the C2 output clocks from each PLL to start glitch free and synchronously.

High frequency output clock C1, such as, 11.25 GHz, requires that these series of latches be extremely fast. To support these speeds, current-mode logic (CML) latches are used, which dissipate static power.

A need exists to implement clock-gating power savings in High Speed Serializer-deserializer (HSS) cores.

SUMMARY OF THE INVENTION

Principal aspects of the present invention are to provide a method and a clock-gating circuit for implementing power savings in High Speed Serializer-deserializer (HSS) cores, and a design structure on which the subject circuit resides. Other important aspects of the present invention are to provide such method, circuit and design structure substantially without negative effect and that overcome many of the disadvantages of prior art arrangements.

In brief, a power saving clock-gating method and a power saving clock-gating circuit for implementing power savings in High Speed Serializer-deserializer (HSS) cores, and a design structure on which the subject circuit resides are provided. The power saving clock-gating circuit includes a clock gate signal used to initiate the starting and stopping of the output C2 clocks. The clock gate signal is applied to a clock gate aligner block, which includes a plurality of latches and, which provides clock gate aligned signal to synchronously start a C2 clock generator. The plurality of latches includes current-mode logic latches. The clock gate signal and the clock gate aligned signal are applied to power savings logic circuit, which generates a power down signal to turn off the plurality of current-mode latches after the C2 clocks have been started, and then responsive to a changed state of the clock gate signal to turn on the plurality of current-mode logic latches to begin another synchronous start operation.

In accordance with features of the invention, the power down signal is applied to predefined clock buffers in a phase locked loop (PLL) divider circuit, and the predefined clock buffers are turned off and turned on with the current-mode logic latches.

In accordance with features of the invention, the power savings logic circuit is a complementary metal oxide semiconductor (CMOS) circuit. A current-mode logic to complementary metal oxide semiconductor (CML/CMOS) converter function applies the clock gate aligned CMOS signal to the power savings logic circuit.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a power saving clock-gating method is provided for implementing power savings in High Speed Serializer-deserializer (HSS) clock-gating circuitry.

Figure 1:
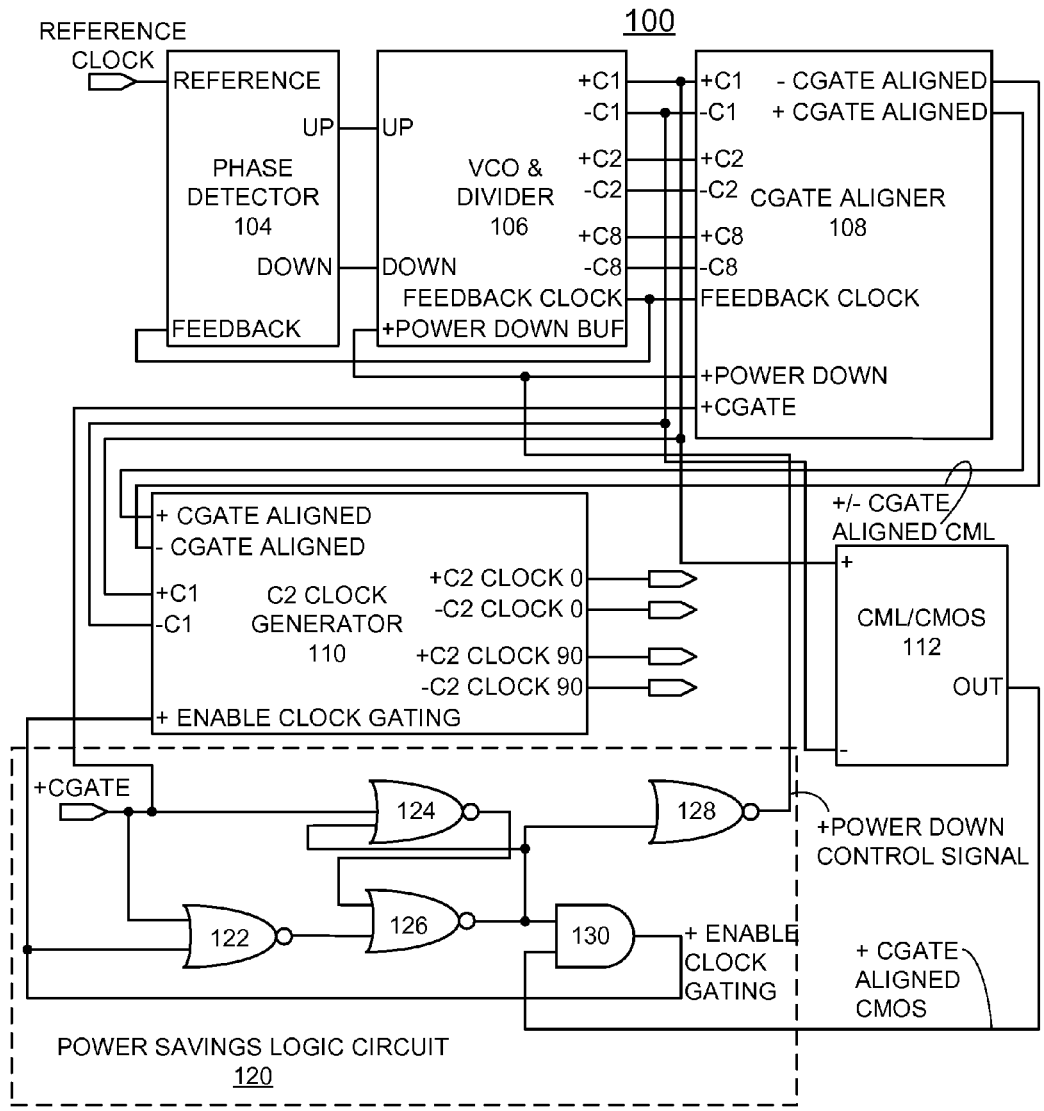
FIG. 1 is a schematic and block diagram representation of a power saving clock-gating circuit in accordance with the preferred embodiment.

Having reference now to the drawings, in FIG. 1, there is shown power saving clock-gating circuit generally designated by the reference character 100 in accordance with the preferred embodiment. The power saving clock-gating circuit 100 includes a phase detector 104 receiving an input signal REFERENCE CLOCK from control logic (not shown) and an input signal FEEDBACK clock signal and providing control outputs UP, DOWN applied to a voltage controlled oscillator (VCO) and divider circuit 106, which generates the FEEDBACK clock. The power saving clock-gating circuit 100 includes a CGATE aligner 108 receiving inputs from the VCO and divider circuit 106 including +/−C1, +/−C2, +/−C8, and FEEDBACK clock signal; and providing +/−CGATE aligned current mode logic (CML) signals to a C2 clock generator 110 and a current mode logic to complementary metal oxide semiconductor (CML CML/CMOS) converter function 112. The C2 clock generator 110 provides multiple output signals +/−C2 CLOCK 0, +/−C2 CLOCK 90, responsive to input signals +/−C1 CLOCK, +/−CGATE ALIGNED, and +ENABLE CLOCK-GATING. The CML/CMOS converter function 112 provides an output signal +CGATE ALIGNED CMOS.

A clock gate signal +CGATE is provided to the CGATE aligner 108 from control logic (not shown), which initiates the starting and stopping of the output clocks C2. The +CGATE signal is timed to go low to start the output clocks C2 before a rising edge of the FEEDBACK clock, which is phase locked to the REFERENCE CLOCK.

The power saving clock-gating circuit 100 includes power savings logic circuit generally designated by the reference character 120 receiving the clock gate signal +CGATE and the signal +CGATE ALIGNED CMOS and generating a pair of control signals ENABLE CLOCK-GATING and POWER DOWN CONTROL SIGNAL. The control signal ENABLE CLOCK-GATING is applied to the C2 clock generator 110, and control signal POWER DOWN CONTROL SIGNAL is applied to both the VCO and divider circuit 106, and the CGATE aligner 108.

The power savings logic circuit 120 includes a plurality of NOR gates 122, 124, 126, 128 and an AND gate 130, connected together as shown. The Clock Gate signal +CGATE is applied to an input of the NOR gates 122, 124. The control signal ENABLE CLOCK-GATING is applied to a second input of the NOR gate 122. An output of the NOR gate 122 and an output Q of the NOR gate 124 are applied to the NOR gate 126, which provides an output Q-bar applied to a second input of NOR gate 124 and an input of NOR gate 128 and AND gate 130. The control signal ENABLE CLOCK-GATING is applied to a second input of the AND gate 130, which provides the control signal ENABLE CLOCK-GATING. The control signal ENABLE CLOCK-GATING output of AND gate 130 is applied to the second input of the NOR gate 128, which provides the output control signal POWER DOWN CONTROL SIGNAL applied to both the VCO and divider circuit 106, and the CGATE aligner 108. The control signal ENABLE CLOCK-GATING output of AND gate 130 is applied to the C2 clock generator 110.

Figure 2:
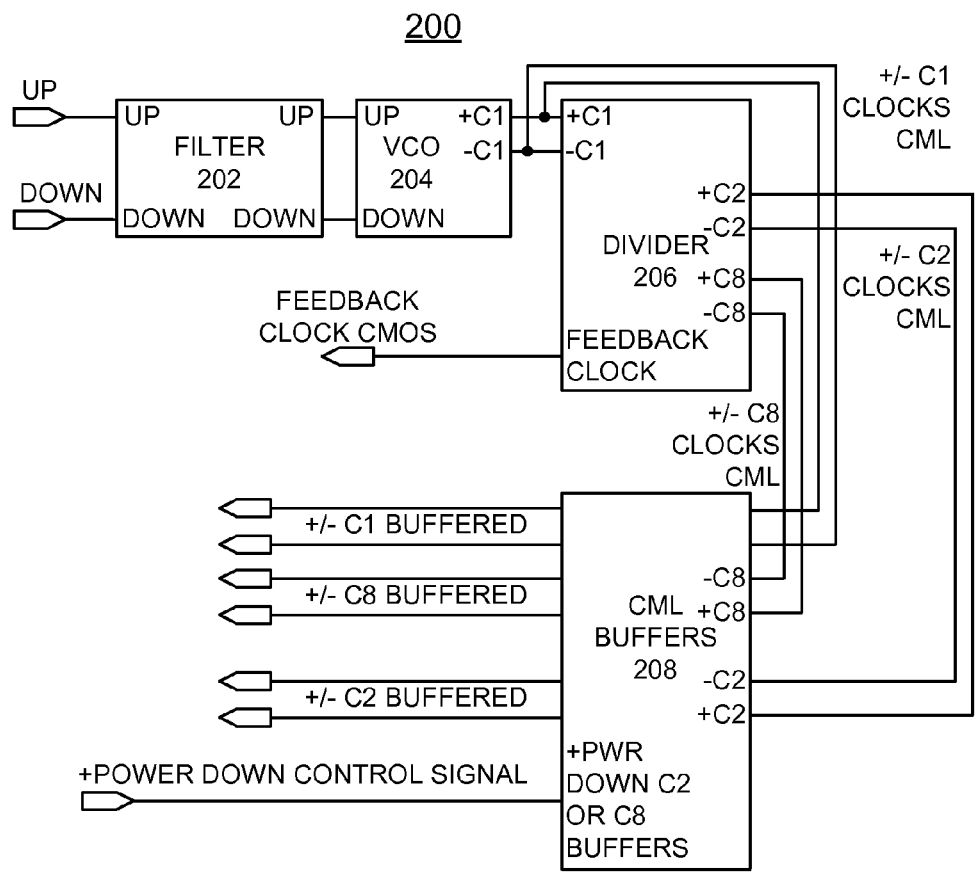
FIG. 2 is a block diagram representation of a phase locked loop (PLL) circuit in accordance with the preferred embodiment.

Referring now to FIG. 2, there is shown an example phase locked loop (PLL) circuit generally designated by the reference character 200 in accordance with the preferred embodiment. PLL circuit 200 includes a filter 202 receiving UP and DOWN inputs and applying UP and DOWN outputs to a voltage controlled oscillator (VCO) 204. VCO 204 applies +/−C1 CLOCKS CML to a divider circuit 106 and CML buffers 208. Divider circuit 106 generates the FEEDBACK clock, and applies +/−C2, +/−C8 CLOCKS CML to the CML buffers 208. The CML buffers 208 provide buffered outputs +/−C1, +/−C2, +/−C8. The control signal POWER DOWN CONTROL SIGNAL of the power savings logic circuit 120 is applied to the CML buffers 208.

Figure 3:
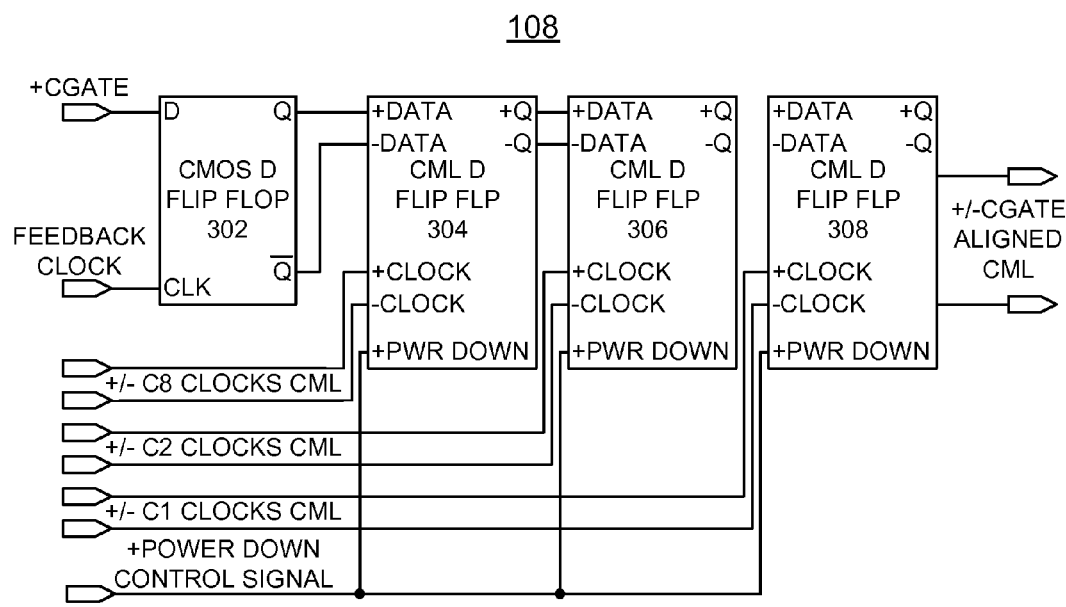
FIG. 3 is a block diagram representation of a CGATE aligner circuit in accordance with the preferred embodiment.

Referring now to FIG. 3, there is shown an example CGATE aligner circuit generally designated by the reference character 108 in accordance with the preferred embodiment. Inside the CGATE Aligner block 108, located in each clock-gating block, there are a series of latches 302, 304, 306, 308. The first latch is a CMOS latch 302, which latches the +CGATE pulse with the rising edge of the Feedback clock. The latches 304, 306, 308 are CML latches. The output of this latch 302 is fed into a second CML latch 304, which is clocked by the divide-by-8 output of the divider 106. This output is, in turn, fed to a third CML latch 306, which is clocked by the divide-by-2 output of divider 106. The output of the third CML latch 306 is fed to a fourth CML latch 308, which is clocked by the C1 clock. The output of this fourth CML latch 308 is used to turn on the divider of C2 clock generator 110, which generates the C2 outputs. The series of high-speed CML latches 304, 306, 308 is provided to accommodate the phase delay tolerances from the PLL divider 106, which is not precise enough to allow using the output of the feedback clock latch directly to start the C2 output. The control signal POWER DOWN CONTROL SIGNAL of the power savings logic circuit 120 is applied to each of the CML latches 304, 306, 308.

Figure 4:
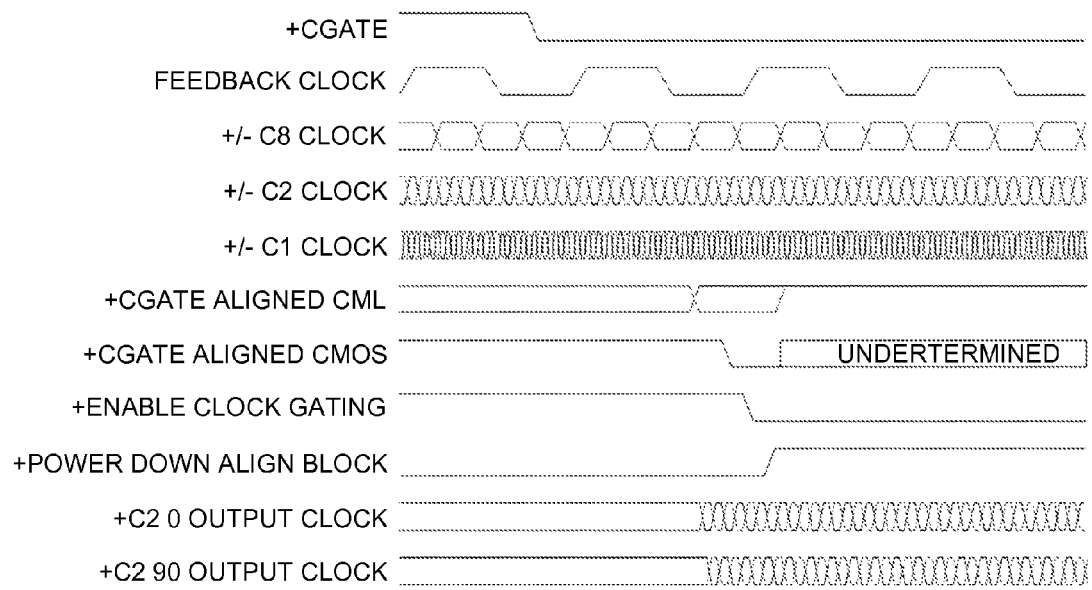
FIGS. 4, and 5 are timing diagrams respectively illustrating C2 clock turn on and turn off in accordance with the preferred embodiment.
Figure 5:
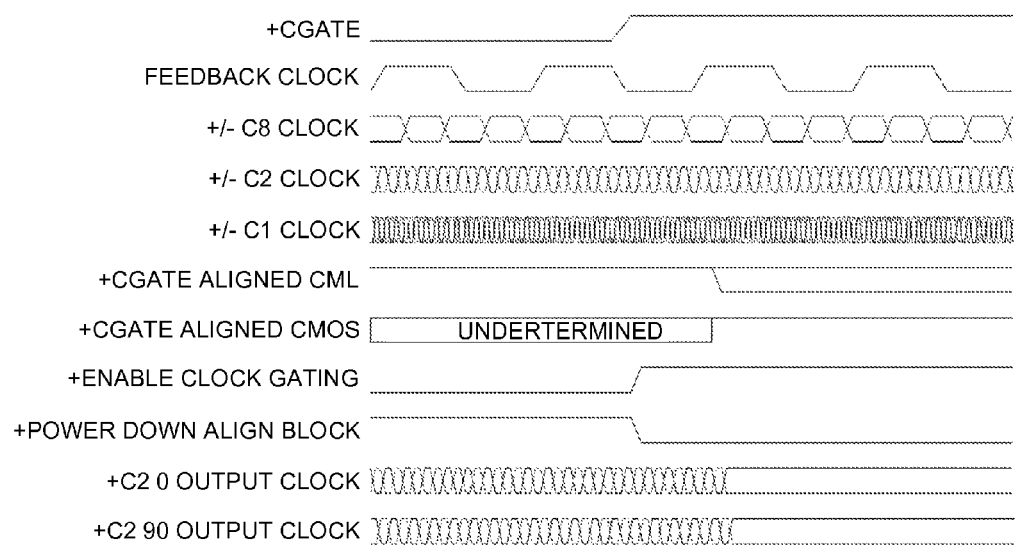

Referring also to FIGS. 4, and 5, there are shown waveforms respectively illustrating C2 clock turn on and turn off in accordance with the preferred embodiment.

The output of the last CML latch 308 in the CGATE ALIGNER block 108 is labeled +/−CGATE ALIGNED CML. Once the differential output of the last latch 308 drops low, the C2 clock generator begins clocking as shown in FIG. 4. The +/−CGATE ALIGNED CML outputs are connected to the CML/CMOS converter function 112. The output of the converter 112 +CGATE ALIGNED CMOS, go low when the CML inputs go low. Once +CGATE ALIGNED CMOS goes low, +ENABLE CLOCK GATING goes low. With +ENABLE CLOCK GATING low, the C2 Clock generator 110 continues to output C2 clocks independent of the levels of +/−CGATE ALIGNED CML.

With +ENABLE CLOCK GATING low, +POWER DOWN CONTROL SIGNAL goes active high powering down the CML latches 304, 306, 308 in the CGATE Aligner block 108 and the C2 and C8 CML buffers 208 in the PLL Divider 200. The C2 and C8 CML buffers 208 drive the C2 and C8 clocks to the CML latches 304, 306, 308. When +ENABLE CLOCK GATING goes low, Q and Q-bar of the simple latch of power savings logic circuit 120 will switch state insuring the +POWER DOWN CONTROL SIGNAL will remain high independent of the level of +CGATE ALIGNED CMOS.

Once the CML latches 304, 306, 308 are powered off in the CGATE aligner block 108, both polarities of the differential signal, +/−CGATE ALIGNED CML, will float up to the supply rail as shown in FIGS. 4 and 5. In this state, the output of the CML/CMOS converter function 112 could be in either the high or low state. The latch is needed in the design to insure the signal +POWER DOWN CONTROL SIGNAL remains high once the power to the CGATE aligner 108 has been turned off. Because both levels of +/−CGATE ALIGNED CML are high when the latches in the CGATE aligner 108 are powered off, the +ENABLE CLOCK-GATING level must be low to insure the C2 clock generator 110 continues to provide the C2 clock outputs independent of the state of +/−CGATE ALIGNED CML.

The latch of power savings logic circuit 120 insures the +ENABLE CLOCK-GATING remains low and +POWER DOWN CONTROL SIGNAL remains high until +CGATE goes back high as shown in FIG. 5. Once +CGATE goes high, the power savings logic circuit 120 latch reverses state and the CGATE aligner block 108 powers up, and the C2 and C8 CML buffers 208 power up. There is no tight alignment required for the turning off of the C2 clocks illustrated in FIG. 5.

Figure 6:
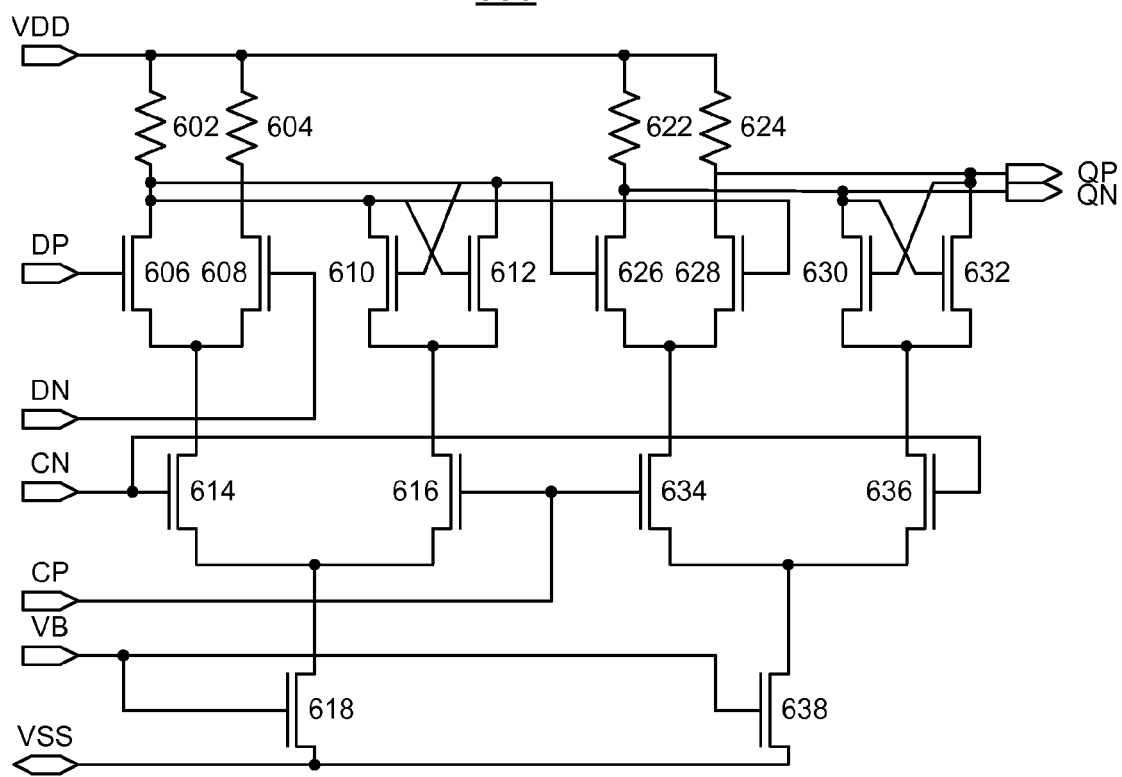
FIG. 6 is a schematic diagram representation of a current mode logic (CML) latch circuit in accordance with the preferred embodiment.

FIG. 6, there is shown an example current mode logic (CML) latch circuit generally designated by the reference character 600 in accordance with the preferred embodiment. CML latch circuit 600 includes a first latch including a first pair of resistors 602, 604, each coupled to a respective one of transistors 606, 608 respectively receiving gate inputs DP, DN and, each coupled to a respective one of cross-coupled transistors 610, 612. Transistors 606, 608 and cross-coupled transistors 610, 612 respectively have a common drain coupled to a respective one of transistors 614, 616, which receive a respective gate input CN, CP Transistors 614, 616 have a common drain coupled to a bias transistor 618 having a drain connected to ground VSS, and a gate input of VB.

CML latch circuit 600 includes a second latch including a second pair of resistors 622, 624, each coupled to a respective one of transistors 626, 628 respectively receiving gate inputs DP, DN and, each coupled to a respective one of cross-coupled transistors 630, 632. Transistors 626, 628 and cross-coupled transistors 630, 632 respectively have a common drain coupled to a respective one of transistors 634, 636, which receive a respective gate input CN, CP. Transistors 634, 636 have a common drain coupled to a bias transistor 638 having a drain connected to ground VSS, and a gate input of VB.

CML latch 600 is powered off by forcing the bias node VB to ground potential VSS.

Figure 7:
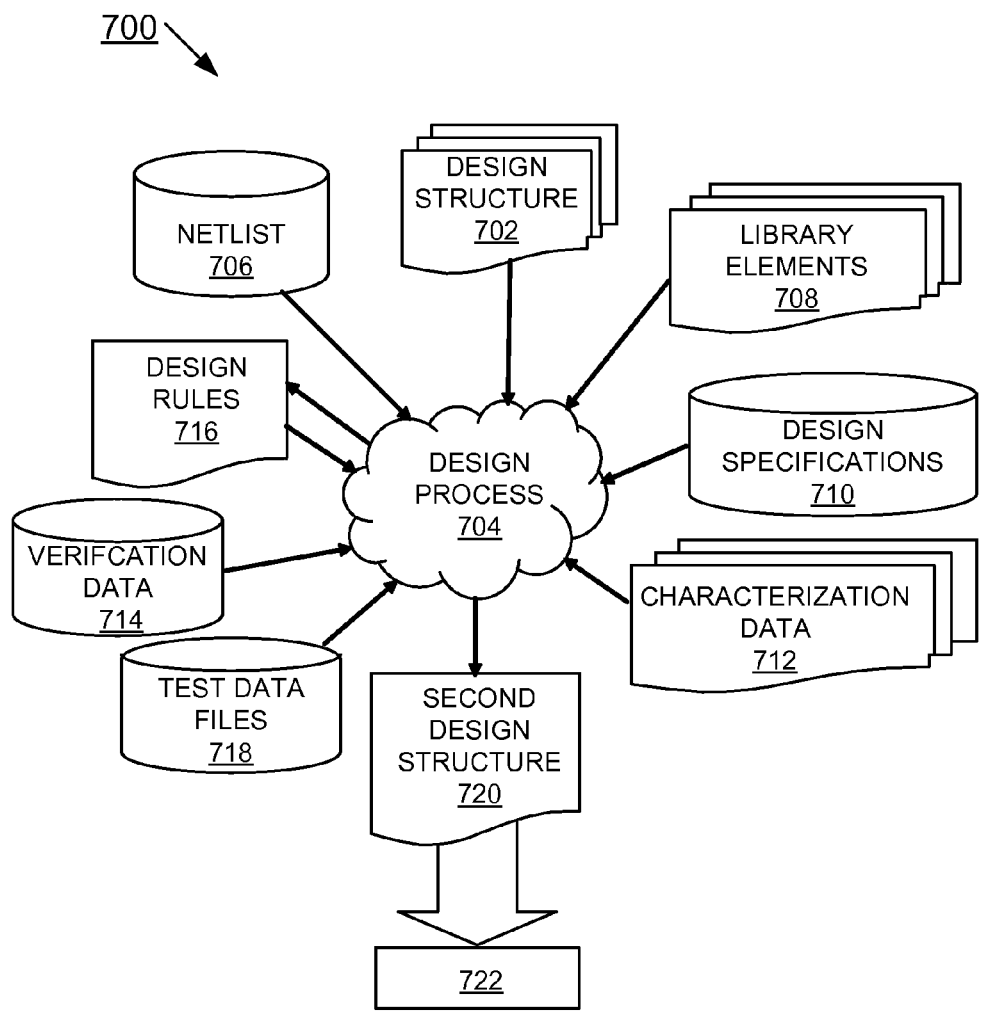
FIG. 7 is a flow diagram of a design process used in semiconductor design, manufacturing, and/or test.

FIG. 7 shows a block diagram of an example design flow 700. Design flow 700 may vary depending on the type of IC being designed. For example, a design flow 700 for building an application specific IC (ASIC) may differ from a design flow 700 for designing a standard component. Design structure 702 is preferably an input to a design process 704 and may come from an IP provider, a core developer, or other design company or may be generated by the operator of the design flow, or from other sources. Design structure 702 comprises circuits 100, 200, 108, and 600 in the form of schematics or HDL, a hardware-description language, for example, Verilog, VHDL, C, and the like. Design structure 702 is tangibly contained on, for example, one or more machine readable medium. For example, design structure 702 may be a text file or a graphical representation of circuits 100, 200, 108, and 600. Design process 704 preferably synthesizes, or translates, circuits 100, 200, 108, and 600 into a netlist 706, where netlist 706 is, for example, a list of wires, transistors, logic gates, control circuits, I/O, models, etc. that describes the connections to other elements and circuits in an integrated circuit design and recorded on at least one of machine readable medium. This may be an iterative process in which netlist 706 is resynthesized one or more times depending on design specifications and parameters for the circuit.

Design process 704 may include using a variety of inputs; for example, inputs from library elements 708 which may house a set of commonly used elements, circuits, and devices, including models, layouts, and symbolic representations, for a given manufacturing technology, such as different technology nodes, 32 nm, 45 nm, 90 nm, and the like, design specifications 710, characterization data 712, verification data 714, design rules 716, and test data files 718, which may include test patterns and other testing information. Design process 704 may further include, for example, standard circuit design processes such as timing analysis, verification, design rule checking, place and route operations, and the like. One of ordinary skill in the art of integrated circuit design can appreciate the extent of possible electronic design automation tools and applications used in design process 704 without deviating from the scope and spirit of the invention. The design structure of the invention is not limited to any specific design flow.

Design process 704 preferably translates an embodiment of the invention as shown in FIGS. 1, 2, 3, and 6 along with any additional integrated circuit design or data (if applicable), into a second design structure 720. Design structure 720 resides on a storage medium in a data format used for the exchange of layout data of integrated circuits, for example, information stored in a GDSII (GDS2), GL1, OASIS, or any other suitable format for storing such design structures. Design structure 720 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2, 3, and 6. Design structure 720 may then proceed to a stage 722 where, for example, design structure 720 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A power saving clock-gating circuit for implementing power savings in High Speed Serializer-deserializer (HSS) cores including output C2 clocks, said power saving clock-gating circuit comprising:
   a clock gate signal used to initiate the starting and stopping of the output C2 clocks;
   a clock gate aligner block receiving said clock gate signal; said clock gate aligner block including a plurality of latches, said clock gate aligner block providing a clock gate aligned signal;
   a C2 clock generator receiving said clock gate aligned signal to synchronously start the output C2 clocks; and
   a power savings logic circuit receiving said clock gate signal and said clock gate aligned signal, a power savings logic circuit generating a power down signal, and said power down signal being applied to said clock gate aligner block to turn off said plurality of current-mode latches after the C2 clocks have been started, and responsive to a changed state of the clock gate signal to turn on said plurality of current-mode logic latches to begin another synchronous start operation.

2. The power saving clock-gating circuit as recited in claim 1, wherein said plurality of latches includes current-mode logic latches.

3. The power saving clock-gating circuit as recited in claim 1, includes a phase locked loop (PLL) divider circuit, said PLL divider circuit including predefined clock buffers.

4. The power saving clock-gating circuit as recited in claim 2, wherein said power down signal is applied said PLL divider circuit to turn off said predefined clock buffers after the C2 clocks have been started, and responsive to a changed state of the clock gate signal to turn on said predefined clock buffers to begin another synchronous start operation.

5. The power saving clock-gating circuit as recited in claim 1, wherein said power savings logic circuit is a complementary metal oxide semiconductor (CMOS) circuit.

6. The power saving clock-gating circuit as recited in claim 1, includes a current-mode logic to complementary metal oxide semiconductor (CML/CMOS) converter function, said CML/CMOS converter function applies said clock gate aligned CMOS signal to the power savings logic circuit.

7. The power saving clock-gating circuit as recited in claim 1, wherein said power savings logic circuit includes an enable clock-gating signal applied to said C2 clock generator.

8. The power saving clock-gating circuit as recited in claim 7, wherein said power savings logic circuit includes a plurality of NOR gates, said clock gate signal applied to a pair of said plurality of NOR gates.

9. The power saving clock-gating circuit as recited in claim 8, wherein said power savings logic circuit includes an AND gate receiving said clock gate aligned signal and a second input applied by another one of said NOR gates; and an output of said AND gate providing said enable clock-gating signal.

10. A power saving clock-gating method for implementing power savings in High Speed Serializer-deserializer (HSS) cores including output C2 clocks, said power saving clock-gating method comprising:
   providing a clock gate signal used to initiate the starting and stopping of the output C2 clocks; applying said clock gate signal to a clock gate aligner block;
   providing a plurality of series connected latches in said clock gate aligner block and generating a clock gate aligned signal;
   providing a C2 clock generator receiving said clock gate aligned signal to synchronously start the output C2 clocks;
   providing a power savings logic circuit;
   applying said clock gate signal and said clock gate aligned signal to said power savings logic circuit and generating a power down signal, and said power down signal being applied to said clock gate aligner block to turn off said plurality of current-mode latches after the C2 clocks have been started, and responsive to a changed state of the clock gate signal to turn on said plurality of current-mode logic latches to begin another synchronous start operation.

11. The power saving clock-gating method as recited in claim 10, wherein providing said plurality of latches in said clock gate aligner block includes providing current-mode logic latches in said clock gate aligner block.

12. The power saving clock-gating method as recited in claim 10, includes providing a phase locked loop (PLL) divider circuit, said PLL divider circuit including predefined clock buffers.

13. The power saving clock-gating method as recited in claim 12, includes applying said power down signal to said PLL divider circuit to turn off said predefined clock buffers after the C2 clocks have been started, and responsive to a changed state of the clock gate signal to turn on said predefined clock buffers to begin another synchronous start operation.

14. The power saving clock-gating method as recited in claim 10, wherein providing said power savings logic circuit includes providing a complementary metal oxide semiconductor (CMOS) circuit.

15. The power saving clock-gating method as recited in claim 10, wherein providing said power savings logic circuit includes providing a plurality of NOR gates, said clock gate signal applied to a pair of said plurality of NOR gates; and providing an AND gate receiving said clock gate aligned signal and a second input applied by another one of said NOR gates; and an output of said AND gate providing an enable clock-gating signal, said enable clock-gating signal applied to said C2 clock generator.

16. A design structure tangibly embodied in a machine readable medium used in a design process, the design structure comprising:
   a power saving clock-gating circuit tangibly embodied in the machine readable medium used in the design process, said power saving clock-gating circuit for implementing power savings in High Speed Serializer-deserializer (HSS) cores including output C2 clocks and said power saving clock-gating circuit including a clock gate signal used to initiate the starting and stopping of the output C2 clocks;
   a clock gate aligner block receiving said clock gate signal; said clock gate aligner block including a plurality of latches, said clock gate aligner block providing a clock gate aligned signal;
   a C2 clock generator receiving said clock gate aligned signal to synchronously start the output C2 clocks; and
   a power savings logic circuit receiving said clock gate signal and said clock gate aligned signal, a power savings logic circuit generating a power down signal, and said power down signal being applied to said clock gate aligner block to turn off said plurality of current-mode latches after the C2 clocks have been started, and responsive to a changed state of the clock gate signal to turn on said plurality of current-mode logic latches to begin another synchronous start operation, wherein the design structure, when read and used in the manufacture of a semiconductor chip produces a chip comprising said power saving clock-gating circuit.

17. The design structure of claim 16, wherein the design structure comprises a netlist, which describes said power saving clock-gating circuit.

18. The design structure of claim 16, wherein the design structure resides on storage medium as a data format used for the exchange of layout data of integrated circuits.

19. The design structure of claim 16, wherein the design structure includes at least one of test data files, characterization data, verification data, or design specifications.

20. The design structure of claim 16, wherein said plurality of latches includes current-mode logic latches.

* * * * *